United States Patent
Anderson

(10) Patent No.: US 10,436,861 B2
(45) Date of Patent: Oct. 8, 2019

(54) MRI DEVICE WITH PLASMA CONDUCTOR

(71) Applicant: Theodore R. Anderson, Brookfield, MA (US)

(72) Inventor: Theodore R. Anderson, Brookfield, MA (US)

(*) Notice: Subject to any disclaimer, the term of this patent is extended or adjusted under 35 U.S.C. 154(b) by 0 days.

(21) Appl. No.: 15/531,645

(22) PCT Filed: Jun. 15, 2016

(86) PCT No.: PCT/US2016/037568
§ 371 (c)(1),
(2) Date: May 30, 2017

(87) PCT Pub. No.: WO2016/205326
PCT Pub. Date: Dec. 22, 2016

(65) Prior Publication Data
US 2017/0371014 A1    Dec. 28, 2017

Related U.S. Application Data

(60) Provisional application No. 62/180,147, filed on Jun. 16, 2015.

(51) Int. Cl.
*G01R 33/385* (2006.01)
*G01R 33/36* (2006.01)
(Continued)

(52) U.S. Cl.
CPC ... *G01R 33/3852* (2013.01); *G01R 33/34007* (2013.01); *G01R 33/36* (2013.01);
(Continued)

(58) Field of Classification Search
CPC .......... G01R 33/34007; G01R 33/3657; G01R 33/385; G01R 33/3854; G01R 33/481; G01R 33/36; G01R 33/3852
See application file for complete search history.

(56) References Cited

U.S. PATENT DOCUMENTS

| 4,949,094 A | 8/1990 | Yukl |
| 5,963,169 A | 10/1999 | Anderson et al. |
| (Continued) | | |

FOREIGN PATENT DOCUMENTS

WO    WO2016041970    3/2016

OTHER PUBLICATIONS

Andrew G. Webb and Sebastian A. Aussenhofer, "Evaluation of plasma-based transmit coils for magnetic resonance," Journal of Magnetic Resonance 261, pp. 49-53.
(Continued)

*Primary Examiner* — Patrick Assouad
*Assistant Examiner* — Haidong Zhang
(74) *Attorney, Agent, or Firm* — Notaro, Michalos & Zaccaria P.C.

(57) ABSTRACT

Apparatus for a nuclear resonance imaging (MRI) machine (100) that includes plasma elements (104, 106, 108). The MRI machine (100) includes gradient coils (104) that generate time-dependent gradient magnetic fields, transmitting elements (106) that excite target molecules (120) with RF energy (122), and receiving elements (108) responsive to RF energy (124) emitted by the excited molecules (120). The gradient coils (104) include plasma conductors (710) in which the plasma (716) is ignited by an exciter (208). The plasma conductors (710) are electrically connected to a gradient amplifier (206) that outputs a signal to produce the gradient fields. The transmitting elements (106) are plasma devices (710) configured to emit RF energy (122). The receiving elements (108) are plasma devices (710) responsive to emitted RF energy (124). An RF exciter (218) selectively and alternatingly ignites said plasma devices (710) to avoid coupling and interference between them.

26 Claims, 6 Drawing Sheets

(51) Int. Cl.
*G01R 33/48* (2006.01)
*G01R 33/34* (2006.01)

(52) U.S. Cl.
CPC ..... *G01R 33/3614* (2013.01); *G01R 33/3657* (2013.01); *G01R 33/385* (2013.01); *G01R 33/3854* (2013.01); *G01R 33/481* (2013.01)

(56) References Cited

U.S. PATENT DOCUMENTS

| | | | |
|---|---|---|---|
| 6,046,705 | A | 4/2000 | Anderson |
| 6,087,992 | A | 7/2000 | Anderson |
| 6,087,993 | A | 7/2000 | Anderson et al. |
| 6,118,407 | A | 9/2000 | Anderson |
| 6,169,520 | B1 | 1/2001 | Anderson |
| 6,369,763 | B1 | 4/2002 | Norris et al. |
| 6,492,951 | B1 | 12/2002 | Harris et al. |
| 6,650,297 | B2 | 11/2003 | Anderson et al. |
| 6,657,594 | B2 | 12/2003 | Anderson |
| 6,674,970 | B1 | 1/2004 | Anderson |
| 6,700,544 | B2 | 3/2004 | Anderson |
| 6,710,746 | B1 | 3/2004 | Anderson et al. |
| 6,806,833 | B2 | 10/2004 | Anderson |
| 6,842,146 | B2 | 1/2005 | Alexeff et al. |
| 6,870,517 | B1 | 3/2005 | Anderson |
| 6,876,330 | B2 | 4/2005 | Alexeff et al. |
| 6,922,173 | B2 | 7/2005 | Anderson |
| 7,145,512 | B2 | 12/2006 | Metz |
| 7,274,333 | B1 | 9/2007 | Alexeff |
| 7,292,191 | B2 | 11/2007 | Anderson |
| 7,342,549 | B2 | 3/2008 | Anderson |
| 7,453,403 | B2 | 11/2008 | Anderson |
| 7,692,271 | B2 | 4/2010 | Anderson et al. |
| 8,077,094 | B2 | 12/2011 | Anderson et al. |
| RE43,699 | E | 10/2012 | Anderson et al. |
| 8,384,602 | B2 | 2/2013 | Anderson |
| 2008/0265887 | A1* | 10/2008 | Linz ................. G01R 33/28 324/318 |
| 2009/0315784 | A1 | 12/2009 | Eberler et al. |
| 2017/0254865 | A1* | 9/2017 | Aussenhofer .... G01R 33/34007 |

OTHER PUBLICATIONS

Michel Moisan, Claude Beaudry, and Philippe Leprince, "A Small Microwave Plasma Source for Long Column Production Without Magnetic Field," IEEE Transaction on Plasma Science, vol. PS-3, No. 2, Jun. 1975.

Sebastian A. Aussenhofer and Andrew G. Webb, "Plasma based MRI," Proceedings of the International Society for Magnetic Resonance in Medicine, ISMRM, 23rd Annual Meeting and Exhibition from May 30 to Jun. 5, 2015, dated May 15, 2015, p. 701.

Notification of Transmittal of the International Search Report and the Written Opinion of the International Searching Authority, or the Declaration, for International Application No. PCT/US2016/037568, dated Nov. 2, 2016, International Filing Date Jun. 15, 2016.

\* cited by examiner

MRI DEVICE WITH PLASMA CONDUCTOR

CROSS-REFERENCE TO RELATED APPLICATIONS

This application is the U.S. National Phase application under 35 U.S.C. § 371 of PCT Application No. PCT/US2016/037568, filed Jun. 15, 2016, which claims the priority of U.S. Provisional Application No. 62/180,147, filed Jun. 16, 2015.

PARTIES TO A JOINT RESEARCH AGREEMENT

The presently claimed invention was made by or on behalf of the below listed parties to a joint research agreement. The joint research agreement was in effect on or before the date the claimed invention was made and the claimed invention was made as a result of activities undertaken within the scope of the joint research agreement. The parties to the joint research agreement are ACADEMISCH ZIEKENHUIS LEIDEN and HALEAKALA R&D, INC.

BACKGROUND

1. Field of Invention

This invention pertains to plasma devices installed in medical imaging devices. More particularly, this invention pertains to plasma devices as gradient coils and as radio frequency transmitting and receiving elements in medical imaging devices, such as magnetic resonance imaging devices.

2. Description of the Related Art

Advances in medical science have resulted in several choices for non-invasive diagnostic imaging beyond x-ray images. Magnetic resonance imaging (MRI) is one such non-invasive imaging that is now available. Positron emission tomography (PET) is another such imaging technique. A recent advance is a combination of magnetic resonance imaging and positron emission tomography for a MRI/PET device.

Magnetic resonance imaging is based on the science of nuclear magnetic resonance (NMR). An MRI device uses magnetic and radio waves to produce detailed morphological information of the organs, tissues and structures within the body. The body, or portions of the body, are immersed in a powerful magnetic field. Radio frequency (RF) energy is transmitted into the body. Pulses of RF energy excites certain atomic nuclei in the body. Commonly, hydrogen atoms are targeted for excitation. The excited nuclei emit RF energy, which is received by the MRI device. Magnetic field gradients are used to pinpoint the location of the received RF energy.

One issue with MRI machines is that the gradient coils are solid, metal conductors. The gradient coils generate strong magnetic fields that are switched. The switched field gradients cause a change in the Lorentz force experienced by the gradient coils. The Lorentz force produces minute expansions and contractions of the coil itself, which because of their solid construction, results in vibration that produces acoustic noise. The noise often sounds like loud banging or clicking to the patient.

Another issue with MRI machines is that the RF transmitting and receiving elements, or antennas, are metal conductors. Each one of the pair of transmitting and receiving elements introduce RF interference (RFI) and/or electromagnetic interference (EMI), which creates noise and reduces signal sensitivity. Commonly, the transmitting element and the receiving element are activated in an alternating sequence with the inactive element detuned and decoupled to minimize the RFI. Additionally, the elements are subject to thermal noise generated by the metal conductor forming the element. The thermal noise is often a significant factor considering the low level of emitted RF energy by the excited nuclei.

Yet another issue with MRI machines is that different frequencies of RF energy are often used, depending upon the nuclei to be excited and the operating conditions of the machine. If each frequency has its own set of RF transmitting and receiving elements, the sets must be separated laterally because, if they are nested radially, the higher frequencies cannot propagate through the set operating at a lower frequency.

Positron emission tomography is a nuclear medicine, functional imaging technique for imaging metabolic processes in the body. The patient is given a tracer, which is a positron-emitting radionuclide on a biologically active molecule. As the radioisotope undergoes positron emission decay, or positive beta decay, the radioisotope emits a positron. The emitted positron interacts with a nearby electron, producing a pair of annihilation photons (gamma radiation) moving in opposite directions. This is an annihilation event. The pair of photons are each detected by one of numerous scintillators or photon, or gamma ray, detectors that surround the patient. In this way the PET machine determines a line through the patient where the line passes through the location where the radioisotope is concentrated. A multitude of annihilation events are detected and computer analysis produces three-dimensional images of the tracer concentration within the body.

Magnetic resonance imaging combined with positron emission tomography is a hybrid device that combines the two devices into a single scan. The co-registration of the two data sets provides both anatomic and metabolic information to aid in diagnosis and treatment of the patient.

For optimal MRI operation, the RF transmitting and receiving elements and the gradient coils must be located close to the patient. Typically these metal components are located between the patient and the photon detectors for the PET portion. One issue with such a combined MRI/PET machine is that the metal elements and coils interfere with the gamma radiation. That is, the metal MRI components attenuate or block the photons before the PET portion detects the photon pairs. Such interference reduces the sensitivity and accuracy of the combined MRI/PET machine.

BRIEF SUMMARY

According to various embodiments of the present invention, plasma elements operating as the gradient coils and/or the RF elements or antennas in a medical imaging machine are provided. Magnetic resonance imaging machines include gradient coils, RF transmitting elements, and RF receiving elements. The gradient coils with plasma conductors improves machine performance and reduces acoustic noise, thereby improving the patient experience. The RF plasma elements improve image quality and, consequently, diagnostics quality. Such plasma based RF elements have reduced coupling effects and interference when judiciously switched, thereby improving quality and allowing multiple portions of the patient to be scanned at the same time, which reduces the scan time.

In one embodiment, the gradient coils have windings that include plasma elements or plasma conductors connected to the gradient control system. The plasma conductor includes a container or vessel that contains a material that forms a plasma when ignited or vaporized and ionized. The plasma conductor is electrically connected to the output of a gradient amplifier. The gradient amplifier output produces a time-dependent gradient magnetic field in each gradient coil. A gradient exciter is coupled to the plasma conductor to ignite the material to generate the plasma. In one embodiment, the plasma conductor does not include any metal that is influenced by the MRI magnetic field. In other embodiments, the gradient coil includes both metal and plasma conductors arranged so as to minimize the influence on the gradient coil by the MRI magnetic field. The plasma in the plasma conductor is not affected by the magnetic field to the same degree that metal or solid conductors are influenced. In this way, the plasma based gradient coils are less susceptible to vibration induced by the magnetic fields, thereby reducing or eliminating the acoustic noise from a scan, which removes one source of patient anxiety.

In another embodiment, the RF transmitting elements and/or the RF receiving elements include plasma elements. The RF elements are connected to a control system that alternates the activation of each one of a pair of transmitting and receiving elements. In this way, the coupling effects and interference between the RF elements is reduced or eliminated. The plasma elements are each selectively activated by igniting the material in a vessel to create plasma. The on-state and the off-state of each plasma element is controlled so that only one of the transmitting elements and the receiving elements operating at a selected frequency is active at a time.

In one such embodiment, multiple RF elements are arranged with a nested configuration. For example, transmitting and receiving elements with a lower operating frequency are positioned between transmitting and receiving elements with a higher operating frequency and the cavity of the imaging machine. The multiple, nested RF elements allows for multiple scans to be performed at the same time, thereby decreasing scan time with reduced interference.

BRIEF DESCRIPTION OF THE SEVERAL VIEWS OF THE DRAWINGS

The above-mentioned features will become more clearly understood from the following detailed description read together with the drawings in which.

DETAILED DESCRIPTION

Apparatus for medical imaging with plasma devices is disclosed. The magnetic resonance imaging (MRI) machine is generally indicated as 100, with particular embodiments and variations shown in the figures and described below having an alphabetic suffix, for example, 100-A and 100-B.

Figure 1:
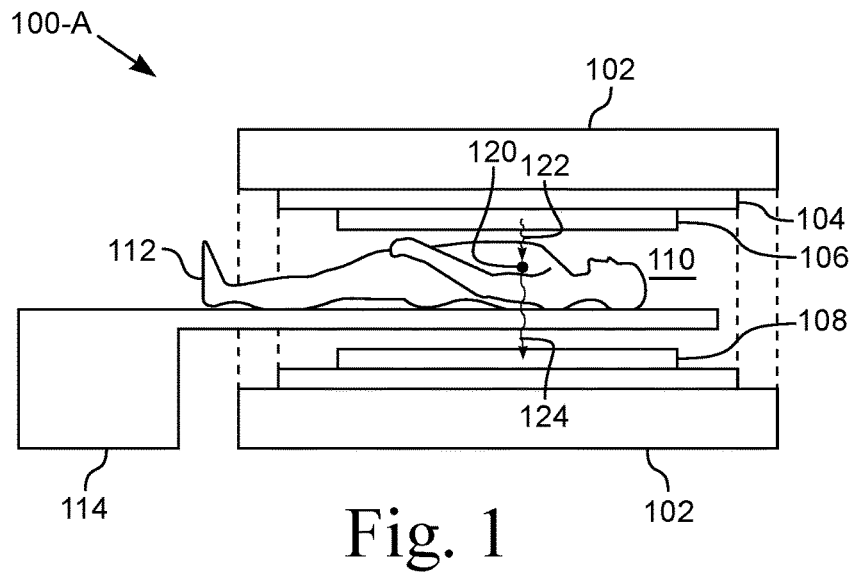
FIG. 1 is a symbolic view of one embodiment of a magnetic resonance imaging (MRI) machine with plasma coils and plasma elements.

FIG. 1 illustrates a symbolic view of one embodiment of a magnetic resonance imaging (MRI) machine 100-A with plasma coils 104 and plasma elements 106, 108. The illustrated MRI machine 100-A is a cylindrical or tubular structure that includes a magnet 102, a set of gradient coils 104, transmitting elements 106, and receiving elements 108. The MRI machine 100-A has a central cavity or bore tube 110 that receives a patient 112 supported on a table 114. Those skilled in the art will recognize that MRI machines can have various configurations and use different arrangements without departing from the spirit and scope of the present invention.

The magnet 102 is a device that generates a magnetic field that passes through the cavity 110. In various embodiments, the magnet 102 is a permanent magnet, an electromagnet, or a combination of the two.

The gradient coils 104 are coils that surround the cavity 110 and generate time-dependent gradient magnetic field pulses in a known manner. The coils 104 individually control the distribution of the magnetic field along the X-axis, the Y-axis, and the Z-axis of the cavity 110. In one embodiment, the gradient coils 104 are windings of plasma conductors 710. The plasma 716 in the plasma conductors 710 is not a solid, therefore the Lorentz force resulting from the changing magnetic field does not create acoustical noise as is encountered when the gradient coils use solid, metal conductors. Further, the dielectric containers are non-magnetic, therefore, the dielectric containers are not subject to Lorentz forces. In this way, the acoustical noise of conventional MRI machines is eliminated, resulting in a less traumatic experience for patients 112.

In one embodiment, the gradient coils 104 are glass, ceramic, or similar dielectric material that each have a general shape of a tube or hollow wire. Each end of the tube has an electrical connection and each tube has an igniter to create the plasma 716 in the plasma device 710. Each tube conforms to the configuration of the gradient coil 104 for the particular X-, Y-, or Z-axis gradient coil 104.

The radio frequency (RF) elements 106, 108 include RF transmitting elements 106 and RF receiving elements 108. The RF transmitting element 106 emits an excitation RF pulse 122 at an exciting frequency that temporarily creates an oscillating transverse nuclear magnetization in the target molecules 120 of the patient 112. The target molecules 120 emit RF energy 124 at an emitted frequency that is sensed by the RF receiving elements 108. In various embodiments, one or both of the RF transmitting elements 106 and RF receiving elements 108 include plasma based RF devices.

The frequency associated with the target molecule 120 depends upon the magnetic field strength of the main magnet 102. For clinical systems in which the magnetic field strength varies between 1.5 and 7 Tesla, the frequency varies between 60 MHz and 300 MHz.

In one embodiment, the RF elements 106, 108 include glass, ceramic, or similar dielectric material that each have a general shape of a tube or hollow member. Each one of the RF elements 106, 108 has an igniter to create the plasma 716 in the plasma device 710. Each one of the RF elements 106, 108, when excited and energized, has a resonant frequency corresponding to the frequency of the target molecules 120.

Figure 2:
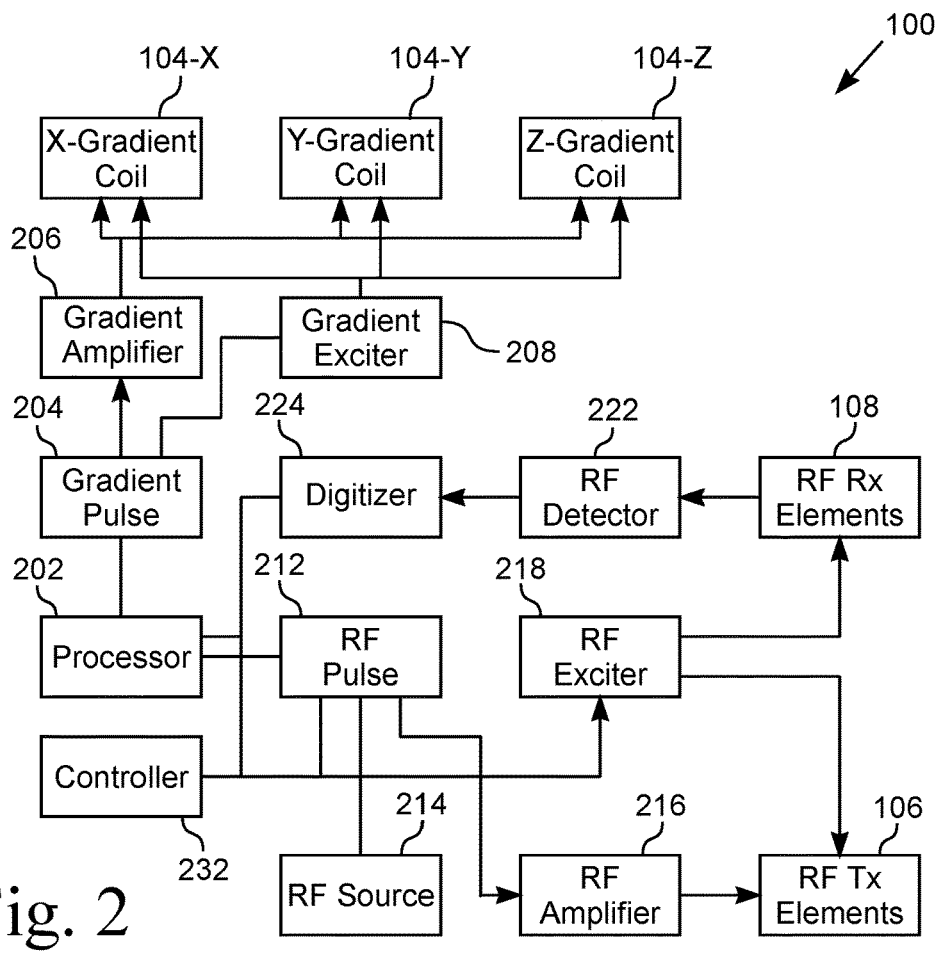
FIG. 2 is a functional block diagram of one embodiment of a magnetic resonance imaging (MRI) machine with plasma coils and plasma elements.

FIG. 2 illustrates a functional block diagram of one embodiment of a magnetic resonance imaging (MRI) machine 100 with plasma coils 104-X, 104-Y, 104-Z and plasma elements 106, 108. A processor 202 executes a program that controls the operation of the MRI machine 100 and processes the data collected by the machine 100.

The processor 202 is connected to the gradient pulse generator 204, which is connected to the gradient amplifier 206. The gradient amplifier 206 drives each of the gradient coils 104-X, 104-Y, 104-Z, individually. Alongside the gradient amplifier 206 is the gradient exciter 208, which excites the individual gradient coils 104-X, 104-Y, 104-Z. In one embodiment, the gradient exciter 208 operates in conjunction with the gradient pulse generator 204. The gradient exciter 208 is a circuit that initiates and maintains the plasma.

The processor 202 is connected to the RF pulse generator 212. The RF pulse generator 212 provides input signals to both the RF source 214 and the RF exciter 218. The RF source 214 outputs the signals at the desired frequency to excite the target molecules. The RF amplifier 216 receives the output from the RF source 218. The RF amplifier 216 is connected to the RF transmitting elements 106. The RF exciter 218 is connected to each RF transmitting element 106 and RF receiving element 108 so that each of the elements 106, 108 is active at the appropriate time without causing interference with the other.

When the RF receiving element 108 is excited by the RF exciter 218, the RF detector 222 senses the signal from the RF receiving element 108. The RF detector 222 outputs a signal to the digitizer 224, which provides an appropriate signal to the processor 202. In one embodiment the digitizer 224 is an analog-to-digital converter (ADC). In one embodiment, the RF transmitting element 106 is also the receiving element 108.

Figure 4:
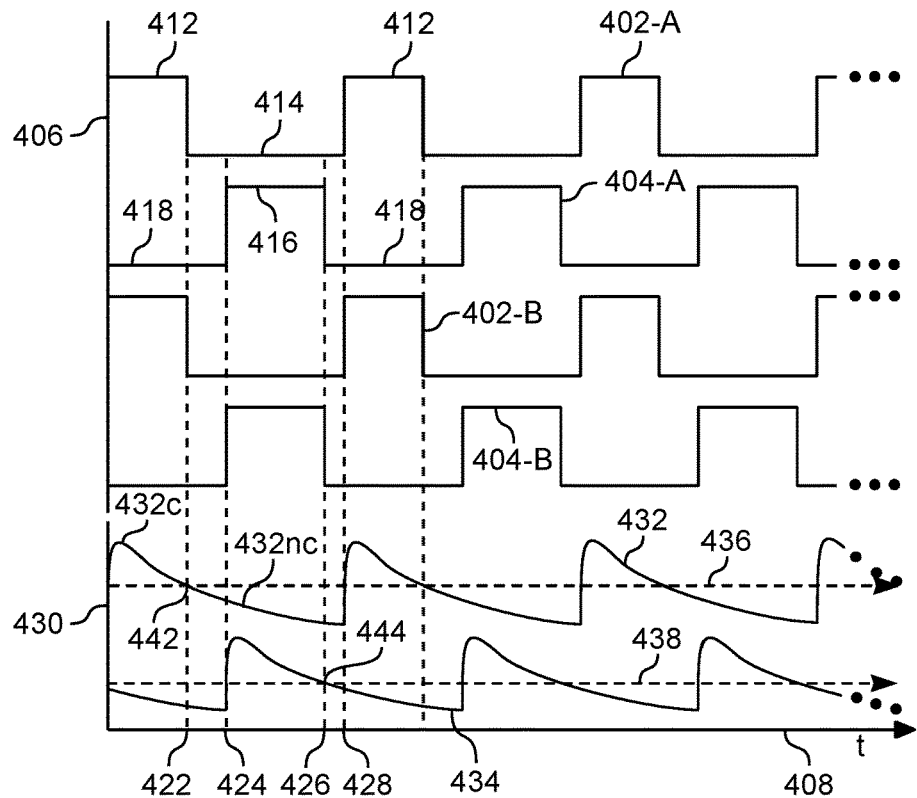
FIG. 4 is a graph showing the timing of the excitation states and the plasma density for the transmitting and receiving elements.

A controller 232 provides timing and other data to the RF pulse generator 212, RF exciter 218, and the digitizer 224. The controller 232 also communicates with the main processor 202. As illustrated in FIG. 4, the RF elements 106, 108 operate with precise timing cycles to avoid or minimize interference and cross-talk between the various RF elements 106, 108. The controller 232 also provides data to the RF exciter 218 to control and/or set the operating parameters of the plasma devices 106, 108. Those parameters include plasma density, plasma temperature, plasma pressure, plasma resistance, and collision frequency. In other embodiments, the functions of the controller 232 are incorporated in and performed by the main processor 202.

As used herein, the processor 202 and controller 232 should be broadly construed to mean any computer or component thereof that executes software. In various embodiments, each one of the processor 202 and controller 232 is one of a general purpose computer processor or a specialized device for implementing the functions of the invention. The processor 202 and controller 232 each includes a memory medium that stores software and data, a processing unit that executes the software, and input/output (I/O) units for communicating with external devices. The input component receives input from external devices, such as the digitizer 224. The output component sends output to external devices, such as the gradient pulse generator 204 and the RF pulse generator 212. The storage component stores data and program code. In one embodiment, the storage component includes random access memory and/or non-volatile memory.

Figure 3:
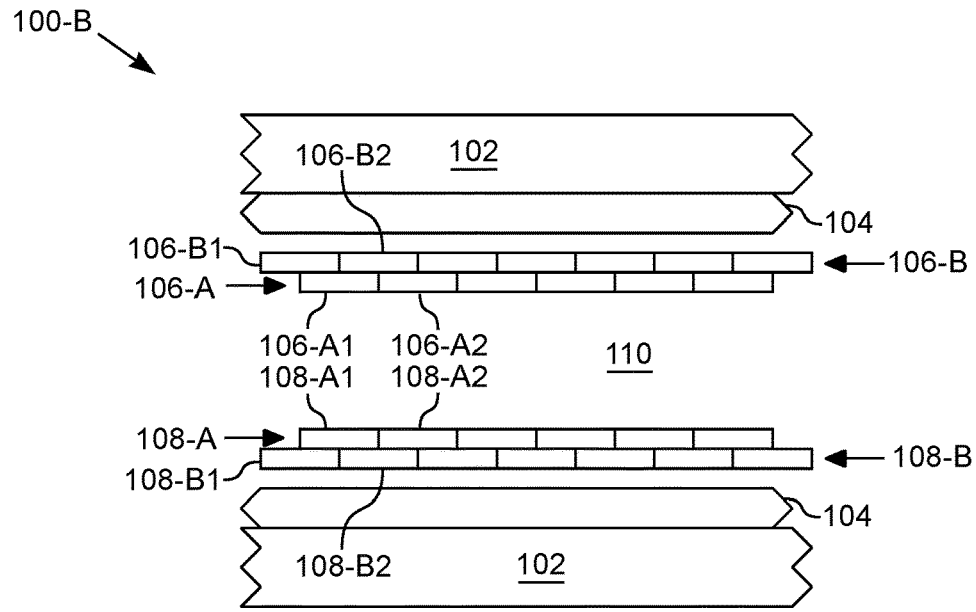
FIG. 3 is a symbolic view of one embodiment of a magnetic resonance imaging (MRI) machine with multiple nested transmitting and receiving elements.

FIG. 3 illustrates a symbolic view of one embodiment of a magnetic resonance imaging (MRI) machine 100-B with multiple nested transmitting elements 106-A, 106-B and receiving elements 108-A, 108-B. MRI machines function by exciting molecules 120 and then detecting the location of those molecules 120. Some types of MRI machines benefit from using multiple frequencies.

The embodiment of the MRI machine 100-B illustrated in FIG. 3 includes a multitude of RF transmitting elements 106-A, 106-B and a multitude of RF receiving elements 108-A, 108-B. One set of RF transmitting elements 106-A operate at a first frequency, with a corresponding set of RF receiving elements 108-A responsive to that frequency. Another set of RF transmitting elements 106-B operate at a second frequency, with a corresponding set of RF receiving elements 108-B responsive to that frequency. The two sets of RF elements 106-A, 108-A & 106-B, 108-B are nested, that is, one set 106-A, 108-A is positioned between the other set 106-B, 108-B and the cavity 110. In other embodiment, three or more sets of RF elements 106-A, 108-A & 106-B, 108-B are nested. In various ones of such embodiments, the RF elements 106-B, 108-B operating at a higher frequency are positioned further from the center of the cavity 110 than the RF elements 106-A, 108-A operating at a lower frequency.

In the illustrated embodiment of the MRI machine 100-B, each set of RF elements 106-A, 108-A & 106-B, 108-B have multiple ones of each. For example, one set of RF elements 106-A, 108-A includes multiple RF transmitting elements 106-A1, 106-A1 positioned side-by-side and multiple RF receiving elements 108-A1, 108-A1 positioned side-by-side. The other set of RF elements 106-B, 108-B includes multiple RF transmitting elements 106-B1, 106-B1 positioned side-by-side and multiple RF receiving elements 108-B1, 108-B1 positioned side-by-side.

FIG. 4 illustrates a graph showing the timing of the excitation states 402-A, 404-A, 402-B, 404-B to the transmitting and receiving elements 106, 108. FIG. 4 also illustrates two waveforms 432, 434 that represent the change in plasma density 430 for the transmitting and receiving elements 106, 108, respectively.

The upper two waveforms 402-A, 404-A apply to the embodiment 100-A where the transmitting elements 106 and receiving elements 108 operate at a single frequency. The upper four waveforms 402-A, 404-A, 402-B, 404-B apply to the embodiment 100-B where the transmitting elements 106 and receiving elements 108 operate at multiple frequencies. The y-axis 406 of the chart adjacent the waveforms 402-A, 404-A, 402-B, 404-B represents signal amplitude. The y-axis 430 of the chart adjacent the plasma density waveforms 432, 434 represents plasma density. The x-axis 408 of the chart represents time t.

The first waveform 402-A represents the on-state 412 and off-state 414 for a transmitting plasma element 106. In the illustrated embodiment the waveform 402-A is shown as a square wave. A person of ordinary skill in the art will recognize that the actual shape of the waveform will vary. The plasma density waveform 432 represents one example of the change in plasma density 430 as a result of the excitation of the transmitting element 106. The waveform 434 represents one example of the change in plasma density 430 as a result of the excitation of the receiving element 108. The two plasma density waveforms 432, 434 are a result of a pulse exciting, or ionizing, the material in the element 106, 108 to form a plasma 716. Application of the ignition pulse causes a rapid increase in the plasma density 430, and the plasma density 430 slowly decreases after the ignition pulse ends.

Regardless of the actual waveform shape, the waveform 402-A has an off-state start time 422 that represents the point on the waveform where the waveform 402-A is considered to represent the off-state 414, which is when the plasma 716 is either extinguished or is electrically non-conductive. Also, the waveform 402-A has an on-state start time 428 that represents the point on the waveform where the waveform 402-A is considered to represent the on-state 412, which is when the plasma 716 is electrically conductive.

When the transmitting plasma element 106 is in the on-state 412, the plasma is active and the element 106 is in a condition suitable for transmitting a signal 122. When the transmitting plasma element 106 is in the off-state 414, the plasma is extinguished and not active and the element 106 is in a condition unsuitable for transmitting a signal 122. When in the off-state 414, the plasma portion of the transmitting element 106 is also electrically non-conductive, which means it is no longer a device with a resonant frequency that contributes to inter-device interference, such as through electromagnetic coupling with the receiving elements 108.

The second waveform 404-A represents the on-state 416 and off-state 418 for a receiving plasma element 108. In the illustrated embodiment the waveform 404-A is shown as a square wave. A person of ordinary skill in the art will recognize that the actual shape of the waveform will vary. Regardless, the waveform 404-A has an on-state start time 424 that represents the point on the waveform where the waveform 404-A is considered to represent the on-state 416 where the plasma 716 is electrically conductive. Also, the waveform 404-A has an off-state start time 426 that represents the point on the waveform where the signal 404-A is considered to represent the off-state 418.

When the receiving plasma element 108 is in the on-state 416, the plasma is active and the element 108 is in a condition suitable for receiving a signal 124. When the receiving plasma element 108 is in the off-state 418, the plasma is not active and the element 108 is in a condition unsuitable for receiving a signal 124. When in the off-state 418, the plasma portion of the receiving element 108 is also electrically non-conductive, which means it is no longer a device with a resonant frequency that contributes to inter-device interference, such as through coupling with the transmitting elements 106.

The transmitting element 106 is excited into the on-state 412 with a short pulse that is sufficient to permit transmitting RF energy 122 to excite the target molecule 120. At the same time, the receiving element 108 is in the off-state 418, which effectively makes the receiving element 108 electromagnetically transparent to the transmitting element 106, thereby preventing the receiving element 108 from interfering with the transmitting element 106. After the transmitting element 106 enters the off-state 414, the receiving element 108 is excited into the on-state 416 with a short pulse that is sufficient to enable the receiving element 108 to receive RF energy 124 emitted by the excited target molecule 120. The difference between the start time 422 for the off-state 414 for the transmitting element 106 and the start time 424 for the on-state 416 for the receiving element 106 is short enough to accommodate the afterglow effects of the plasma in the transmitting element 106 and short enough to prevent significant decay of the RF energy 124 emitted from the excited target molecule 120.

After the receiving element 108 enters the off-state 418, the transmitting element 106 is excited into the on-state 412 with a short pulse that is sufficient to enable the transmitting element 106 to transmit RF energy 122 to excite the target molecule 120. The difference between the start time 426 for the off-state 418 for the receiving element 108 and the start time 428 for the on-state 412 for the transmitting element 108 is short enough to accommodate the afterglow effects of the plasma in the receiving element 108.

The transmitting element 106 has an off-state 414 that has a longer duration than the on-state 416 of the receiving element 108. The receiving element 108 has an off-state 418 that has a longer duration than the on-state 412 of the transmitting element 106. In this way only one of the transmitting elements 106 and the receiving elements 108 is in the on-state 412, 416 at a time, which prevents the other from interfering with the one that is in the on-state 412, 416.

For an embodiment having sets of transmitting elements 106-A, 106-B and receiving elements 108-A, 108-B operating at different frequencies, such as illustrated in FIG. 3, the second set of waveforms 402-B, 404-B apply in addition to the first set of waveforms 402-A, 404-A.

The transmitting elements 106-A, 106-B have similar waveforms 402-A, 402-B, respectively, exciting the elements 106-A, 106-B at the same time. The receiving elements 108-A, 108-B have similar waveforms 404-A, 404-B, respectively, exciting the elements 108-A, 108-B at the same time. The two sets of transmitting elements 106-A, 106-B operate simultaneously without interacting or interfering with each other when the transmitting elements 106-A, 106-B operate at different frequencies or when the elements 106-A, 106-B are separated by a space sufficient to prevent interference. The two sets of receiving elements 108-A, 108-B also operate simultaneously without interacting or interfering with each other when the receiving elements 108-A, 108-B operate at different frequencies or when the elements 108-A, 108-B are separated by a space sufficient to prevent interference.

In another embodiment, the duty cycle of the waveforms 402-A, 404-A, 402-B, 404-B are substantially different than illustrated. The duty cycle is the ratio of the durations of the on-state 412, 416 to the off-state 414, 418. The on-state 416 of the first receiving element 108-A follows closely after the start of the off-state 412 of the first transmitting element 106-A. While the first transmitting element 106-A is still in the off-state 414, the second transmitting element 106-B enters the on-state 412 so that it can transmit a signal 122 at a second frequency. While the first transmitting element 106-A is still in the off-state 414, the second receiving element 108-B has its on-state 416 closely following the second transmitting element 106-B going into the off-state 414. In this way, each transmitting element 106-A, 106-B and receiving element 108-A, 108-B operates at different times, thereby avoiding any coupling and interference issues between the various elements 106-A, 106-B, 108-A, 108-B. In such an embodiment, the duty cycle is such that the off-states 414, 418 are much greater in duration than the on-states 412, 416. The off-states 414, 418 have a duration long enough for multiple on-states 412, 416 to occur during each off-state 414, 418.

A plasma 716 is a partially ionized gas that provides an electrically conductive path, similar to a conductive metal. But, unlike a metal device that has its electrical properties fixed within narrow limits because of its solid structure, a plasma is a complex state of matter and the electrical characteristics of the plasma are varied by adjusting various properties of the plasma. For example, the thermal noise is lowered in a plasma device by operating the plasma device with the Ramsauer-Townsend effect or when the plasma is in the afterglow state.

Conventional RF elements based on metal coils or conductors are subject to mutual coupling and electromagnetic interference (EMI). Conventional MRI machines use various techniques, with varying degrees of success, to reduce coupling effects and EMI. Those techniques include detuning the receiving elements when the transmitting elements are transmitting and then detuning the transmitting elements when attempting to receive the emitted RF energy 124. Plasma elements are not subject to the same effects as metal elements. A plasma element in which the plasma is extinguished or below a density threshold 436, 438 is not electrically conductive and cannot couple to another RF element, nor can it contribute any EMI to other elements 106, 108. The plasma 716 is extinguished or non-conductive when the plasma element 106, 108 is in an off-state 414, 418.

Plasma 716 conducts electricity when its plasma density 430 is above a threshold value 436, 438. For example, when the plasma density waveform 432 for the transmitting element 106 has a plasma density 432$c$ above the threshold density 436, the plasma 716 is electrically conductive. When the plasma density waveform 432 crosses 442 the threshold density 436 and has a plasma density 432$nc$ below the threshold density 436, the plasma 716 is electrically non-conductive. The same is true for the plasma density waveform 434 for the receiving element 108 when it crosses 444 the threshold density 438.

Figure 5:
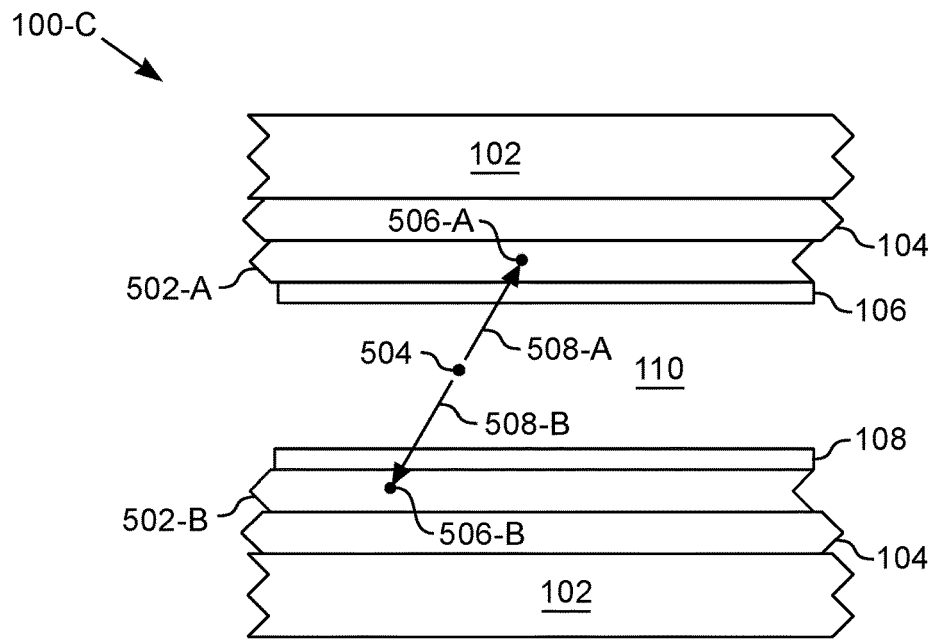
FIG. 5 is a symbolic view of one embodiment of a magnetic resonance imaging (MRI) machine with positron emitting tomography (PET) components.

FIG. 5 illustrates a symbolic view of one embodiment of a magnetic resonance imaging (MRI) machine 100-C with positron emitting tomography (PET) components 502-A, 502-B. A class of medical imaging machines includes MRI with co-registered PET, that is, the combination MRI and PET machine 100-C produces a composite image showing data acquired via MRI and PET.

The illustrated embodiment of the MRI/PET machine 100-C includes a magnet 102, a set of gradient coils 104, transmitting elements 106, and receiving elements 108. The MRI/PET machine 100-C also includes opposing sets of photon detectors 502-A, 502-B that encircle the cavity 110. The photon detectors 502 are scintillators that are responsive to the pairs of photons 506-A, 506-B traveling in opposite directions 508A, 508-B from the annihilation event 504.

The transmitting elements 106 and receiving elements 108 are positioned between the annihilation event 504 and the photon detectors 502-A, 502-B. The transmitting and receiving elements 106, 108 are plasma devices and do not obstruct or otherwise impede the gamma radiation from the annihilation event 504 as would happen if the transmitting and receiving elements 106, 108 were metal devices. The photons 506-A, 506-B easily pass through the plasma devices 710 without attenuation or obstruction.

Figure 6:
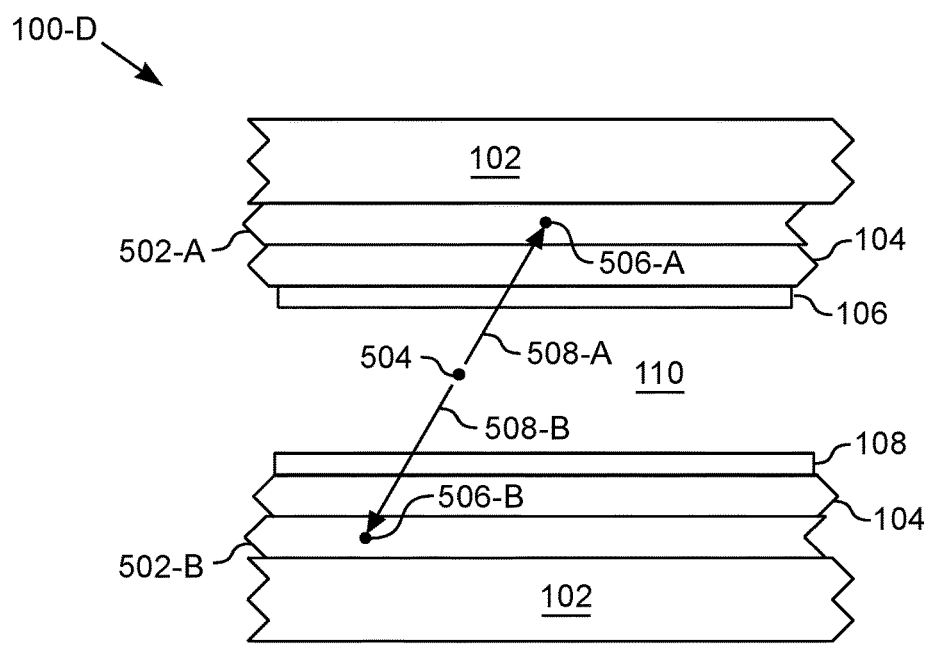
FIG. 6 is a symbolic view of another embodiment of a magnetic resonance imaging (MRI) machine with positron emitting tomography (PET) components.

FIG. 6 illustrates a symbolic view of another embodiment of a magnetic resonance imaging (MRI) machine 100-D with positron emitting tomography (PET) components 502-A, 502-B. The embodiment illustrated in FIG. 6 is similar to the machine 100-C illustrated in FIG. 5, except that the gradient coils 104 are also located between the photon detectors 502-A, 502-B.

The sensitivity and accuracy of magnetic resonance imaging depends upon the magnetic strength and the ability to detect the emitted RF energy from the targeted molecules 120. One way to increase the impact of the magnetic field is to move the magnetic gradient coils 104 closer to the patient 112. Likewise, the closer the transmitting and receiving elements 106, 108 are to the target molecule 120, the more precise and accurate is the mapping of those target molecules 120. The photon detectors 506-A, 506-B positioned outside the gradient coils 104 and the transmitting and receiving elements 106, 108 allows the coils 104 and elements 106, 108 to be advantageously positioned without adversely impacting the ability of the photon detectors 506-A, 506-B to detect annihilation events 504.

Figure 7:
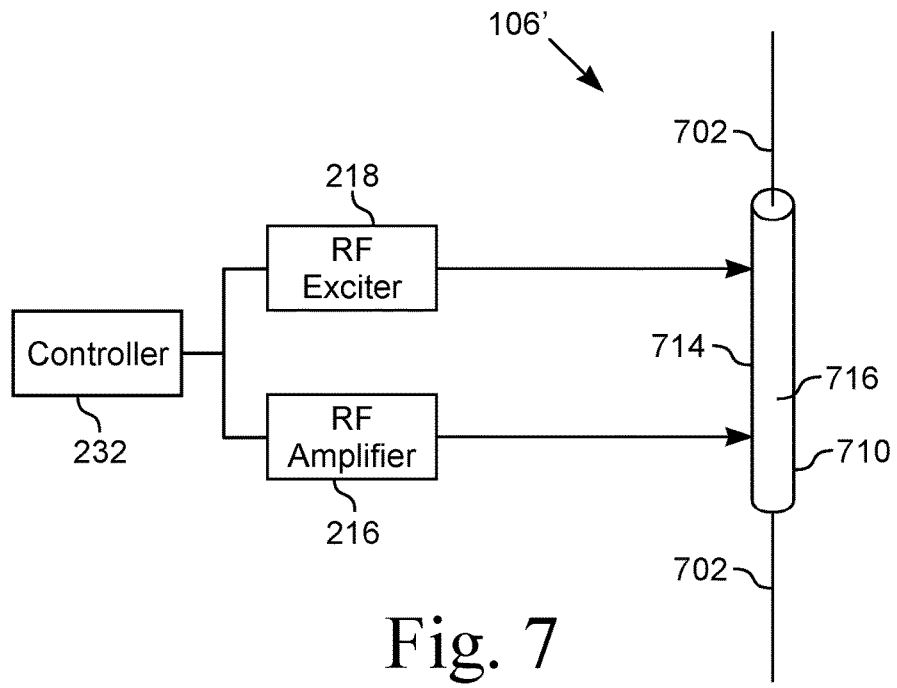
FIG. 7 is a block diagram of one embodiment of a transmitting element that is a hybrid plasma device.

FIG. 7 illustrates a block diagram of one embodiment of a transmitting element 106' that is a hybrid plasma device. A hybrid plasma device is a device that includes a plasma device portion 710 and a non-plasma portion 702. The RF exciter 218 excites or ignites the material inside the plasma vessel 714 to create a plasma 716 inside the plasma device 710. The RF amplifier 216 operates on the transmitting element 106' to induce the element 106' to transmit an electromagnetic wave 122. The controller 323 controls the RF exciter 218 and the RF amplifier 216, either directly or through the RF pulse generator 212.

The illustrated embodiment of the transmitting element 106' is a hybrid plasma device because the element 106' includes a plasma device 710 and a pair of radiating elements 702. The radiating elements 702 are electrically connected in series to the plasma 716. In another embodiment, the radiating elements 702 are electromagnetically coupled to the plasma 716. In various embodiments, the transmitting element 106' includes one or more radiating elements 702 with various configurations. For example, in various embodiments, the transmitting element 106' is a dipole, a monopole, a loop, or other type of antenna. When the plasma device 710 has a plasma density 432$c$ above a threshold density 436, the plasma 716 is excited to a conductive state and provides a conductive path for transmitting an electromagnetic wave 122. When the plasma 716 has a plasma density 432$nc$ below the threshold density 436, the plasma 716 is non-conductive and the element 106' is not capable of transmitting or receiving at a desired frequency, thereby detuning the element 106' and reducing or eliminating the potential of interfering with other elements 106', 108.

FIG. 7 illustrates the connections to one embodiment of an RF transmitting element 106'. In another embodiment, the RF receiving element 108 has a similar configuration, except the connection to the RF amplifier 216 is replaced by a connection to the RF detector 222. In this way, portions of the transmitting and receiving elements 106', 108 are metal radiating elements 702 where appropriate for the configuration of a particular MRI machine 100. Also, in one embodiment, the gradient coils 104 are similarly hybrid devices having a plasma device 710 in series connection with metal conductors 702. The plasma devices 710 are strategically located in series with the metal conductors of the gradient coils 104 so as to minimize the generation of acoustic noise.

Plasma 716 is a fundamental state of matter, different than solids, gases, and liquids. In various embodiments, the gradient coils 104, the transmitting elements 106, and the receiving elements 108 are plasma devices 710. Each of these devices 104, 106, 108 share common features, such as the vessel 714 containing the plasma 716. A common type of plasma device 710 is a fluorescent lamp.

The vessel 714 is a sealed, hollow member that contains a material suitable for forming a plasma 716. The vessel 714 has a configuration that conforms to the shape necessary to perform its function. For example, the plasma conductor 710 for each gradient coil 104 has the vessel 714 conforming to the shape of the winding that produces the desired magnetic field. The plasma member 710 for each of the transmitting elements 106 and the receiving elements 108 has a vessel 714 that conforms to the shape of the element 106, 108 desired for the element 106, 108 to perform its function. In various embodiments, the vessel 714 has an end-to-end configuration that is linear or that is curved either as a chord or a loop or other arcuate shape.

The vessel 714 is an insulator, such as a dielectric material. If required, the electrical connection to the plasma 716 inside the vessel 714 is made through the electrical leads, or electrodes, 702, 812 at each end of the vessel 714. In other embodiments, the electrodes 702, 812 are located at various positions between the ends of the vessel 714.

Figure 8:
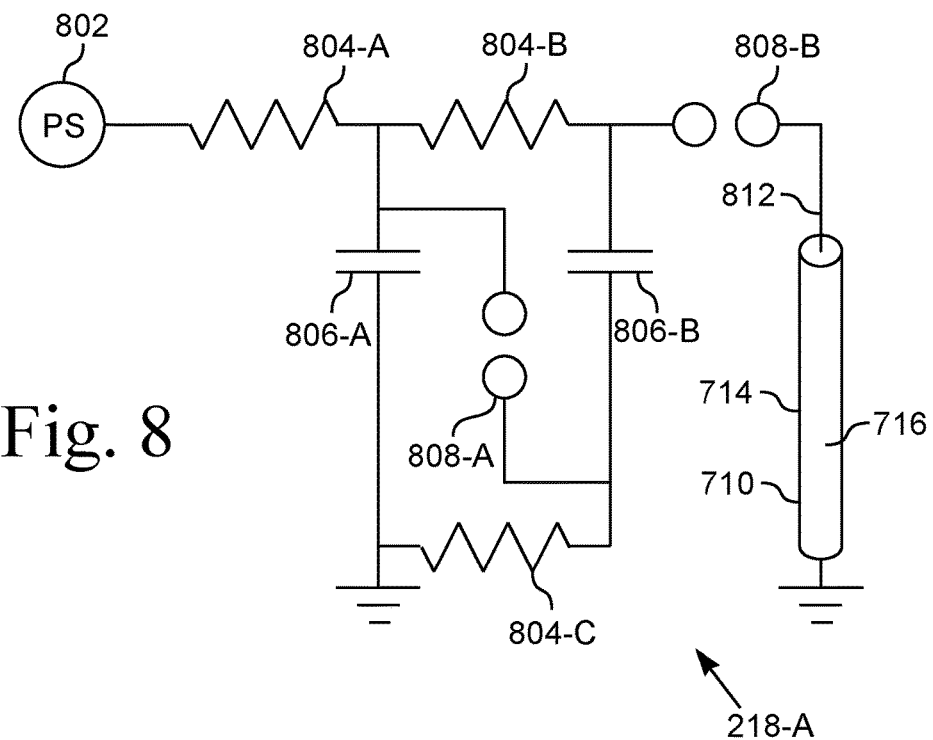
FIG. 8 is a schematic of a first embodiment of an exciter for a plasma device.
Figure 9:
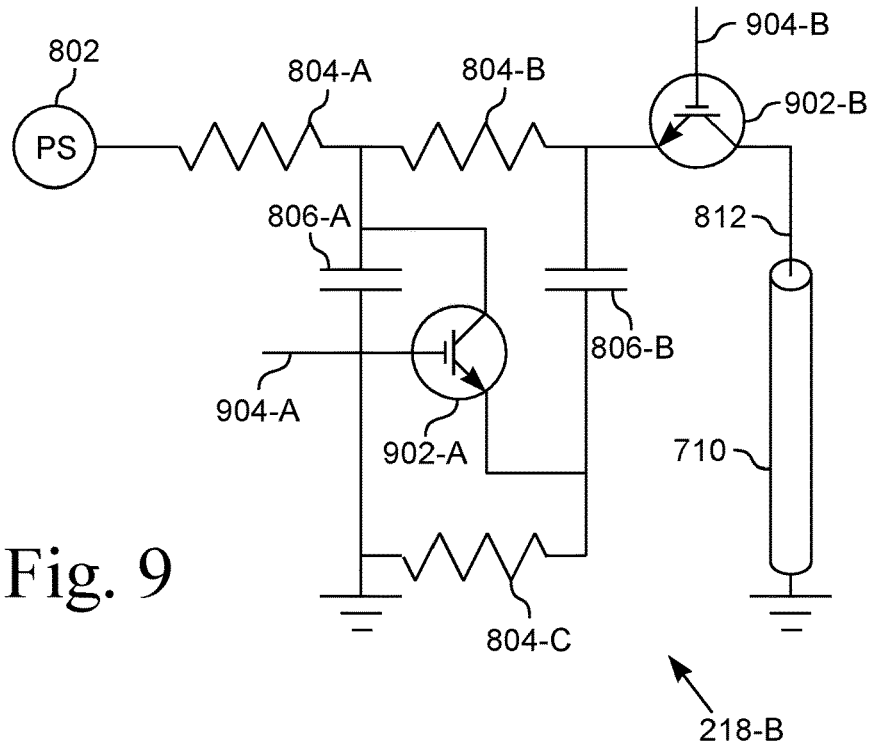
FIG. 9 is a schematic of a second embodiment of an exciter for a plasma device
Figure 10:
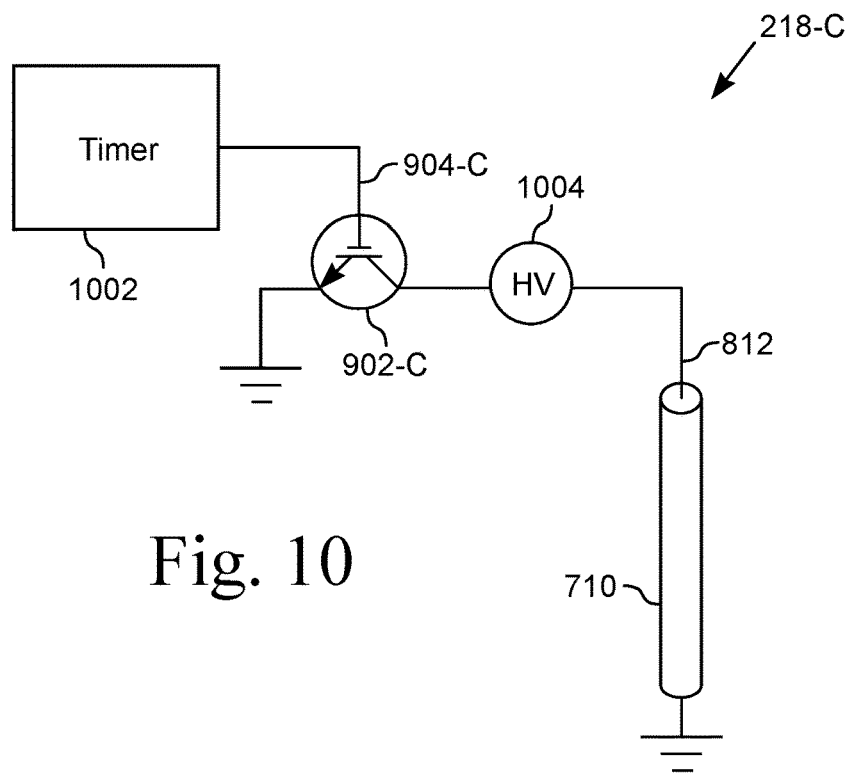
FIG. 10 is a schematic of third embodiment of an exciter for a plasma device
Figure 11:
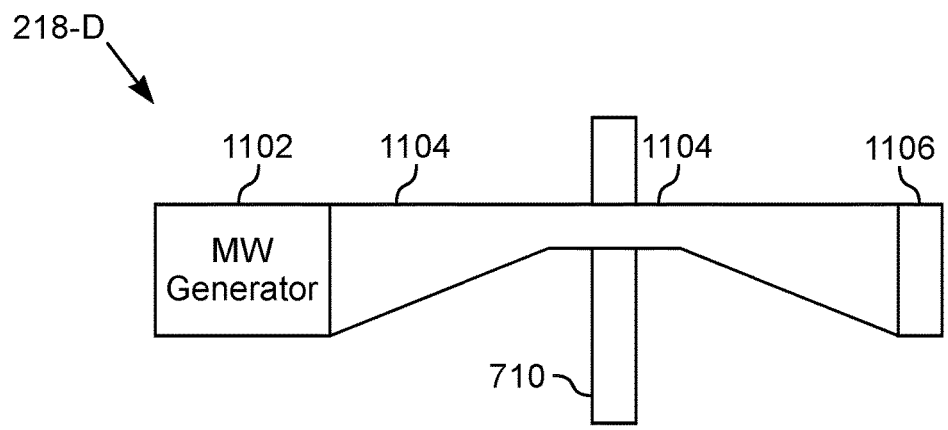
FIG. 11 is a schematic of fourth embodiment of an exciter for a plasma device

The plasma device 710 has an exciter 218 that creates the plasma 716 in the vessel 714. The plasma excitation is accomplished in various ways, for example, a direct electrical connection, such as illustrated in FIGS. 8, 9, & 10, by microwave energy, such as illustrated in FIG. 11, by laser energy, and by appropriate electromagnetic fields. The RF elements 106, 106', 108 also require a connection for transmitting electromagnetic waves or receiving electromagnetic waves. These connections are accomplished in various ways, for example, by a direct electrical connection to the plasma 716 via the electrodes 702, 812 or by inductive or electromagnetic coupling to the plasma 716. The gradient coils 104 require a connection to conduct current to generate the time-dependent gradient magnetic field, for example, by a direct electrical connection to the plasma 716 via the electrodes 702, 812.

FIGS. 8 and 9 illustrate the leads 812 providing a connection for the excitation power. In one embodiment, those leads 812 also provide the electrical connection for the gradient amplifier 206, the RF amplifier 216, or the RF detector 222, depending on the application of the plasma device 710. In another embodiment, separate leads provide an electrical connection for the gradient amplifier 206, the RF amplifier 216, or the RF detector 222. In one embodiment, the physical dimensions and configuration of a plasma device 710 are selected based on the operating frequency of the plasma device 710. For example, the length of the plasma 716 inside the vessel 714 is a factor in determining the resonant frequency of the plasma device 710.

The transmitting and receiving elements 106, 106', 108 are near field devices, particularly considering the lower frequencies of many MRI machines 100 in which they operate. That is, the transmitting and receiving elements 106, 106', 108 are antennas that operate primarily by interacting with electromagnetic fields, as opposed to far field antennas that interact with electromagnetic radiation.

FIG. 8 illustrates a schematic of a first embodiment of an RF exciter 218-A for a plasma device 710, such as a transmitting element 106. The material inside the vessel 714, before it changes state to be plasma 716, must be excited or ionized. FIG. 8 illustrates one such excitation circuit 218-A that creates a plasma 716 inside the vessel 714. In various embodiments, the RF exciter 218 includes an excitation circuit 218-A such as the one illustrated in FIG. 8.

The excitation circuit 218-A is a Marx Generator that generates high-voltage pulses from a low voltage direct current power supply 802. The plasma device 710 includes one or more electrical connections 812 that are electrodes that complete the electrical circuit between the external components 218 and the plasma 716 inside the vessel 714. A plasma 716 is generated when a material become an ionized gas through excitation or ignition. Generating a plasma 716 is accomplished by the application of an electric and/or magnetic field, RF heating, laser excitation, or other means. The Marx Generator 218-A applies a high voltage pulse to the plasma device 710 and the high voltage pulse creates a electric field that ignites the plasma 716.

The circuit 218-A includes resistors 804-A, 804-B, 804-C and capacitors 806-A, 806-B with a configuration where the capacitors 806-A, 806-B are charged in parallel until the first spark gap 808-A reaches its breakdown voltage. The second spark gap 808-B isolates the excitation circuit 218-A from the load of the plasma device 710. When the first spark gap 808-A reaches its breakdown voltage, a spark is generated, thereby creating a circuit path that places the capacitors 806-A, 806-B in series, effectively doubling the voltage of the power source 802. The doubled voltage exceeds the breakdown voltage of the second spark gap 808-B, thereby applying the voltage to the lead 812 on the plasma device 710. The breakdown voltage of the second spark gap 808-B is sufficiently high to ionize the material inside the vessel 714 to form a plasma 716. The spark gaps 808-A, 808-B act as momentary switches that apply a voltage pulse 412, 416 to the plasma device 710 through the conductor 812. The voltage pulse 412, 416 ionizes the vapor or gas in the vessel 714. When the voltage pulse is extinguished, the plasma 716 survives for a short time in the vessel 714. For example, a voltage pulse with a duration of one microsecond creates a plasma that survives for approximately 1 millisecond.

The excitation circuit 218-A is a pulse generator that generates voltage pulses at regular intervals, as determined by the RC time constant of the various resistors 804 and capacitors 806. The illustrated circuit 218-A is a two-stage circuit. To increase the output voltage, additional stages are added.

FIG. 9 illustrates a schematic of a second embodiment of an exciter 218-B for a plasma device 710. The excitation circuit 218-B is a modified Marx Generator that has insulated gate bipolar transistors (IGBT) as switches 902-A, 902-B instead of the spark gaps 808-A, 808-B. The switches 902-A, 902-B perform similar functions as the spark gaps 808-A, 808-B, except that operation of the switches 902-A, 902-B is controlled by signals applied to the gate connections 804-A, 804-B instead of when the charge accumulates on the capacitors 806 such that the breakdown voltage is reached.

A first signal at a triggering level is applied to the gate connection 904-A of the first switch 902-A, which places the capacitors 806-A, 806-B in series, effectively doubling the voltage of the power source 802. A second signal at a triggering level is applied to the gate connection 904-B of the second switch 902-B at about the same time as the first signal is applied to the first gate connection 904-A. The second switch 902-B, when triggered, applies the full voltage to the connection 812 of the plasma device 710, thereby creating the plasma 716. In one embodiment, the first and second signals are controlled by the processor 202 with a timing appropriate to fire and activate the plasma device 710 as desired for operation of the imaging machine 100. In another embodiment, the controller 232 controls the first and second signals. Both the start time 424, 428 and the stop time 422, 426 of each pulse is controllable, resulting in the pulse on-state 412, 416 having a desired duration, as well as the off-state 414, 418 having a desired duration.

FIG. 10 illustrates a schematic of a third embodiment of an exciter 218-B for a plasma device 710. The illustrated embodiment of the exciter 218-C is a general form of an excitation circuit. A timer 1002 provides a trigger signal to the gate connection 904-C of a switch 902-C. The switch 902-C is in series with a high voltage power source 1004, which is connected to the lead 812 of the plasma device 710.

The timer 1002, in various embodiments, is a circuit of discrete components, an integrated circuit, or a timer software program controlling an output of the processor 202 or controller 232. The timer 1002 provides a timing signal, such as the ones that generate the waveforms 402, 404 illustrated in FIG. 4, to the switch 902-C. The timer 1002 and switch 902-C form a pulse driver circuit that drives a high voltage source 1004. In one embodiment, the source 1004 is an excitation circuit 218-B, such as the one illustrated in FIG. 8, with the switch 902-C driving the gate connections 904-A, 904-B.

FIGS. 8, 9, and 10 illustrate simplified schematics of various embodiments of RF excitation circuits 208, 218. The simplified schematics do not illustrate various connections; however, those skilled in the art will recognize the need for such wiring and understand how to wire such a circuit, based on the components ultimately selected for use.

FIG. 11 illustrates a schematic of a fourth embodiment of an exciter 218-D for a plasma device 710. The illustrated exciter 218-D is a surfatron that includes a microwave generator 1102 coupled to a waveguide 1104 and a conductive end 1106 on the opposite side of the waveguide 1004 relative to the microwave generator 1102. The plasma device 710 penetrates a narrowed portion 1108 of the waveguide 1104. The narrowed section 1108 intensifies the microwave electric field in the waveguide 1104, thereby igniting and sustaining the plasma 716 in the vessel 704.

For the embodiments that require a direct electrical connection to the plasma 716, the leads 702, 812 into the vessel 714 provide electrical connections for devices such as the gradient amplifier 206, the RF amplifier 216, and the RF detector 222.

In one embodiment, the microwave generator 1102 is modulated with a signal such that, when used with a transmitting element 106, the transmitting element 106 becomes active and emits RF energy 122 at the desired frequency to excite the target molecules 120.

The MRI machine 100 includes various functions. The function of reducing acoustic noise in the MRI machine 100 is implemented, in one embodiment, by the gradient coils 104 formed with plasma conductors 710. Unlike solid, metal conductors, plasma 716 is not affected by the magnetic fields in the MRI machine 100 and, therefore, acoustic noise producing vibrations are not induced in the plasma conductors 710 of the gradient coils 104.

The function of reducing electromagnetic coupling and interference between the transmitting elements 106 and the receiving elements 108 is implemented, in one embodiment, by extinguishing the plasma 716 in the non-operating one of the elements 106, 108. With the non-operating plasma element 106, 108 in the off-state 414, 418, the non-operating plasma element 106, 108 becomes electromagnetically transparent to the operating plasma element 106, 108.

The function of decreasing the scan time for an MRI machine 100 is implemented, in one embodiment, by using multiple transmitting elements 106-A1, 106-A2 and receiving elements 108-A1, 108-A2 with non-overlapping on-states 412, 416. In another embodiment, the function of decreasing the scan time for an MRI machine 100 is implemented by nesting the transmitting elements 106-A, 106-B and the receiving elements 108-A, 108-B.

From the foregoing description, it will be recognized by those skilled in the art that a medical imaging system 100 with plasma elements 104, 106, 108 has been provided. The gradient coils 104 with plasma conductors 710 reduces or eliminates the acoustic noise encountered in conventional MRI machines. The RF transmitting and receiving elements 106, 108 are plasma elements 710 that are operated with a duty cycle that eliminates electromagnetic coupling and interference. The RF transmitting and receiving elements 106, 108 are readily retrofitted into existing MRI machines by removing the metal elements and adding the plasma elements 106, 108, along with the associated equipment, such as the RF exciter 218 and the programming to generate the excitation waveforms 402-A, 404-A, 402-B, 404-B.

While the present invention has been illustrated by description of several embodiments and while the illustrative embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described.

What is claimed is:

1. An apparatus for imaging an object through nuclear magnetic resonance, said apparatus comprising:
   a magnet producing a magnetic field that passes through a space;
   a first gradient coil that generates a time-dependent gradient magnetic field that passes through said space, said first gradient coil having a winding that includes a plasma conductor;
   an exciter configured to create a plasma in said plasma conductor; and
   a gradient amplifier having an output electrically connected to said plasma in said plasma conductor.

2. The apparatus of claim 1 further including a second gradient coil and a third gradient coil, said second gradient coil generates a second time-dependent gradient magnetic field that passes through said space, said second gradient coil having a second winding that includes a second plasma conductor, said third gradient coil generates a third time-dependent gradient magnetic field that passes through said space, and said third gradient coil having a third winding that includes a third plasma conductor.

3. The apparatus of claim 1 wherein said plasma conductor includes a vessel configured to contain said plasma, and said vessel having a configuration that generates said time-dependent gradient magnetic field when said plasma is ignited by said exciter.

4. The apparatus of claim 1 further including a first transmitting element proximate said space, said first transmitting element configured to emit a first exciting frequency, and a first receiving element proximate said space, said first receiving element responsive to a first emitted frequency, at least one of said first transmitting element and said first receiving element including a plasma element.

5. The apparatus of claim 4 wherein said first transmitting element includes a first plasma element and said first receiving element includes a second plasma element.

6. The apparatus of claim 5 further including a RF exciter selectively generating said plasma in said first and second plasma elements such that only one of said first and second plasma elements is active at a time.

7. The apparatus of claim 5 further including a second transmitting element and a second receiving element, said second transmitting element including a third plasma element, said second receiving element including a fourth plasma element, said second transmitting element configured to emit a second exciting frequency, said second receiving element responsive to a second emitted frequency, said second transmitting element positioned between said first transmitting element and said cavity, and said second receiving element positioned between said first receiving element and said cavity.

8. The apparatus of claim 7 wherein said first exciting frequency is greater than said second exciting frequency of said second transmitting element.

9. The apparatus of claim 1 further including a set of photon detectors positioned proximate said cavity, said photon detectors responsive to photons emitted during an annihilation event; said photon detectors providing data for positron emission tomography, and said plasma conductor positioned between said photon detectors and said cavity.

10. The apparatus of claim 9 further including a first transmitting element proximate said space and a first receiving element proximate said space, said first transmitting element configured to emit a first exciting frequency, said first receiving element responsive to a first emitted frequency, and at least one of said first transmitting element and said first receiving element including a plasma element.

11. The apparatus of claim 10 wherein said plasma element is included in said first transmitting element, and said first transmitting element positioned between said photon detectors and said cavity.

12. The apparatus of claim 10 wherein said plasma element is included in said first receiving element, and said first receiving element positioned between said photon detectors and said cavity.

13. The apparatus of claim 1 wherein said exciter includes a driver circuit controlling a high voltage power source, said driver circuit including a timer operatively controlling a switch, and said switch selectively applying a high voltage to said plasma conductor to ignite said plasma.

14. The apparatus of claim 1 wherein said exciter includes a surfatron that creates said plasma in said plasma conductor.

15. An apparatus for imaging on object through nuclear magnetic resonance, said apparatus comprising:
a magnet producing a magnetic field that passes through a space;
a set of gradient coils that generate a set of time-dependent gradient magnetic fields that pass through said space, each one of said set of gradient coils has a winding that includes a plasma conductor, each said plasma conductor including a vessel containing a material, said apparatus further including a gradient exciter and a gradient amplifier, said gradient exciter configured to ignite said material in each vessel to create a plasma, and said gradient amplifier electrically connected to each plasma conductor to generate said time-dependent gradient magnetic field;
a first transmitting element proximate said space, said first transmitting element configured to emit a first exciting frequency;
a first receiving element proximate said space, said first receiving element responsive to a first emitted frequency, at least one of said first transmitting element and said first receiving element including a plasma element; and
an RF exciter configured to create a plasma in said plasma element.

16. The apparatus of claim 15 wherein said RF exciter outputs an excitation signal with a specified duty cycle.

17. The apparatus of claim 15 wherein said first transmitting element includes a first plasma element and said first receiving element includes a second plasma element.

18. The apparatus of claim 17 wherein said RF exciter selectively creates said plasma in said first and second plasma elements such that only one of said first and second plasma elements is active at a time.

19. The apparatus of claim 17 further including a second transmitting element and a second receiving element, said second transmitting element including a third plasma element, said second receiving element including a fourth plasma element, said second transmitting element configured to emit a second exciting frequency, said second receiving element responsive to a second emitted frequency, said second transmitting element positioned between said first transmitting element and said cavity, and said second receiving element positioned between said first receiving element and said cavity.

20. The apparatus of claim 19 wherein said first exciting frequency is greater than said second exciting frequency of said second transmitting element.

21. The apparatus of claim 15 further including a set of photon detectors positioned proximate said cavity, said photon detectors responsive to photons emitted during an annihilation event; said photon detectors providing data for positron emission tomography, and said plasma element is positioned between said photon detectors and said cavity.

22. The apparatus of claim 21 wherein said plasma element is included in said transmitting element.

23. The apparatus of claim 21 wherein said plasma element is included in said receiving element.

24. The apparatus of claim 21 wherein said set of gradient coils is positioned between said photon detectors and said cavity.

25. The apparatus of claim 15 wherein said RF exciter includes a driver circuit controlling a high voltage power source, said driver circuit including a timer operatively controlling a switch, said switch selectively applying a high voltage to said plasma element to ignite said plasma.

26. The apparatus of claim 15 wherein said first transmitting element includes said plasma element and said RF exciter includes a surfatron that creates said plasma in said plasma element, said surfatron applying a signal to said first transmitting element to generate RF energy at said first exciting frequency.

* * * * *